United States Patent [19]
Porter

[11] Patent Number: 5,653,280
[45] Date of Patent: Aug. 5, 1997

[54] HEAT SINK ASSEMBLY AND METHOD OF AFFIXING THE SAME TO ELECTRONIC DEVICES

[75] Inventor: Warren W. Porter, Escondido, Calif.

[73] Assignee: NCR Corporation, Dayton, Ohio

[21] Appl. No.: 554,172

[22] Filed: Nov. 6, 1995

[51] Int. Cl.$^6$ .................................................. F28F 7/00
[52] U.S. Cl. .................... 165/80.3; 165/185; 174/16.3; 361/704; 361/707
[58] Field of Search ........................ 165/80.3, 185, 165/46; 174/16.3; 257/722; 361/703, 704, 707, 718

[56] References Cited

U.S. PATENT DOCUMENTS

| | | | |
|---|---|---|---|
| 2,711,382 | 6/1955 | Smith-Johannsen | 165/185 X |
| 3,694,182 | 9/1972 | Akfirat et al. | 165/185 X |
| 3,836,825 | 9/1974 | Hall et al. | 361/718 |
| 3,972,821 | 8/1976 | Weidenbenner et al. | 165/185 X |
| 4,654,754 | 3/1987 | Daszkowski . | |
| 4,730,666 | 3/1988 | Flint et al. | 165/46 X |
| 4,733,453 | 3/1988 | Jacoby | 165/80.3 X |
| 4,838,347 | 6/1989 | Dentini et al. . | |
| 5,038,858 | 8/1991 | Jordan et al. | 165/185 |
| 5,168,348 | 12/1992 | Chu et al. . | |
| 5,168,926 | 12/1992 | Watson et al. | 165/185 |
| 5,265,321 | 11/1993 | Nelson et al. . | |
| 5,270,902 | 12/1993 | Bellar et al. . | |
| 5,285,108 | 2/1994 | Hastings et al. . | |
| 5,309,321 | 5/1994 | Olla et al. | 165/185 X |
| 5,353,193 | 10/1994 | Chia et al. . | |
| 5,366,688 | 11/1994 | Terpstra et al. | 419/36 |
| 5,397,919 | 3/1995 | Tata et al. . | |

FOREIGN PATENT DOCUMENTS

| | | | |
|---|---|---|---|
| 7929 | 2/1980 | European Pat. Off. | 165/185 |
| 2511010 | 9/1976 | Germany | 165/80.3 |

Primary Examiner—Leonard R. Leo
Attorney, Agent, or Firm—Paul J. Maginot

[57] ABSTRACT

A method of affixing heat sink assemblies to integrated circuit devices includes the following steps (1) providing a first heat sink assembly having a first base, with the first base having a first layer of adhesive material disposed thereon, and with a first strippable liner positioned over and in contact with the first layer of adhesive material, (2) removing the first strippable liner from the first layer of adhesive material, (3) positioning the first heat sink assembly in contact with a first integrated circuit device mounted on a printed circuit board such that the first layer of adhesive material is interposed between the first base and the first integrated circuit device, (4) removing the first integrated circuit device from the printed circuit board, (5) providing a second heat sink assembly having a second base, with the second base having a second layer of adhesive material disposed thereon, and with a second strippable liner positioned over and in contact with the second layer of adhesive material, (6) removing the second strippable liner from the second layer of adhesive material, (7) positioning the second heat sink assembly in contact with a second integrated circuit device such that the second layer of adhesive material is interposed between the second base and the second integrated circuit device, and (8) mounting the second integrated circuit device to the printed circuit board. A heat sink assembly having a base, a plurality of thermally conductive fins and a layer of adhesive material disposed on the base is also disclosed.

7 Claims, 3 Drawing Sheets

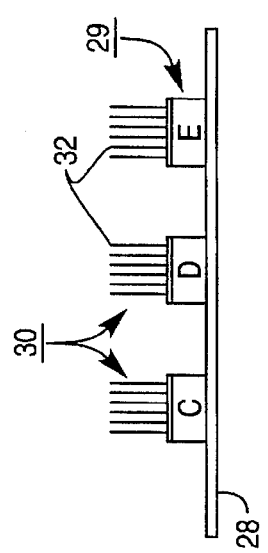
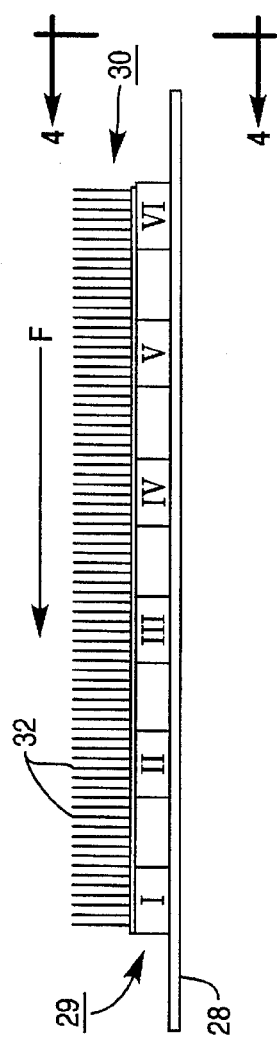
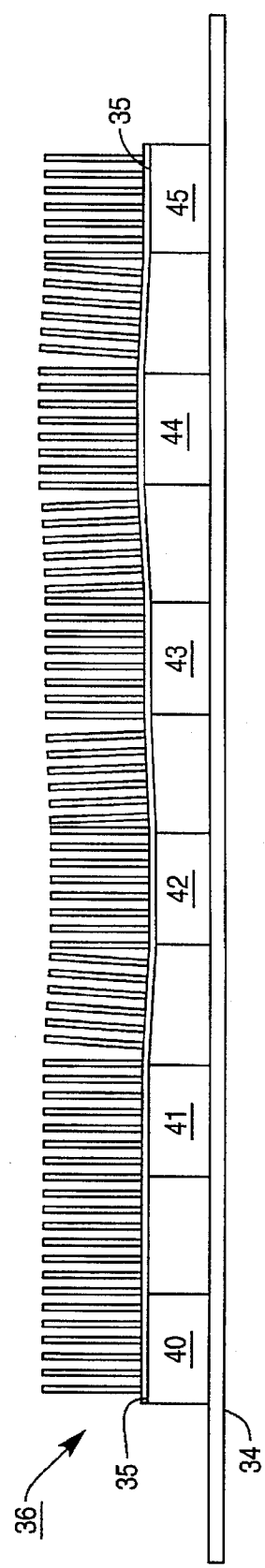
FIG. 4
FIG. 3
FIG. 5

HEAT SINK ASSEMBLY AND METHOD OF AFFIXING THE SAME TO ELECTRONIC DEVICES

BACKGROUND OF THE INVENTION

The present invention generally relates to dissipation of heat generated by electronic devices, and more particularly to a heat sink assembly and method of affixing the heat sink assembly to electronic devices.

The cooling of integrated circuit devices is necessary to ensure their proper operation and to extend their useful life.

A trend in contemporay integrated circuit design is to position multiple integrated circuits on a printed circuit board in an array. A consequence of providing an array of integrated circuit devices on a printed circuit board which operate at relatively high speeds is substantial heat production which may be detrimental to these electronic devices. Thus, a need exists for efficient and convenient methods and apparatus for thermal management of integrated circuit arrays and similar type devices.

Various designs of apparatus that cool integrated circuit devices have been developed. For example, U.S. Pat. No. 5,397,919 discloses a heat sink assembly adapted for use with an electronic device package such as a microprocessor. The apparatus includes a threaded base of a finned heat sink adapted to be received in a threaded bore of an adapter which mounts onto the electronic device package. Desired thermal coupling is achieved by screwing down the heat sink in biasing engagement with the package.

Another example is U.S. Pat. No. 5,168,348 which teaches an impingement cooled compliant heat sink comprised of a metal sheet that is brought into contact with chips on a multi-chip module. The metal sheet acts as a spreader plate for jet impingement immersion cooling with a fluorocarbon, liquid nitrogen, or other dielectric liquids. Slots and/or holes in the sheet located between the chip sites serve to: (1) create flexible joints in the sheet between the chips to permit conformity to neighboring chip sites, (2) allow for clearance of decoupling capacitors and other structures on the substrate between the chips, and (3) permit the dielectric coolant to flow through the plate so that there will be no pressure difference across the compliant heat sink.

Yet another example is U.S. Pat. No. 4,654,754 which describes a thermal link between a heat source and heat sink that compensates for irregularities on the surface of the aforementioned components and/or nonuniformity in the spacing therebetween. The thermal link utilizes a spring metal device having a free arm which allows the link to align itself under low pressure so that it is in intimate contact with both the heat source and heat sink. Another embodiment utilizes an elastomeric material filled with thermally conductive particles to form a mat that has a plurality of raised sections having air spaces between each of the sections. The raised sections deform under low pressure by expanding laterally into the air spaces to conform to the space between the heat source and the heat sink.

U.S. Pat. No. 4,838,347 describes a compressible thermally conductive member comprising a polymer field with thermally conducting, magnetically aligned particles comprising a base portion and a multiplicity of protrusions extending from at least one surface of the base portion. At least when compressed, a thermal path exists across the thickness of the thermally conductive member.

U.S. Pat. No. 5,270,902 teaches a heat transfer device for use with a heat sink in removing thermal energy from an integrated circuit chip. The device includes a first membrane of flexible, thermally conductive material having a first surface in contact with the integrated circuit chip. A flexible, thermally conductive radial finger spring is disposed in contact with a second surface of the first membrane. A second membrane of flexible, thermally conductive material is included. The second membrane has a first surface in contact with the spring and a second surface in contact with the heat sink.

U.S. Pat. No. 5,285,108 teaches a cooling member for an integrated circuit, the member has a recess therein for receiving the integrated circuit and contacting a portion of the exterior surfaces of the integrated circuit and a portion of metal leads extending from the integrated circuit; in one aspect, such a member has a plurality of such recesses for accommodating a plurality of such integrated circuits; and in one aspect, such a system includes a metal heat sink.

U.S. Pat. No. 5,265,321 discloses an integrated circuit structure and method of making in which the circuit has a plurality of metal exchanger elements spaced from each other with their first ends secured to the structure. The first ends may be adhesively secured to an integrated circuit chip or the underlying substrate, and the heat exchanger may be hermetically attached. The method uses a compliant removable support block for attaching the plurality of individual heat exchanger elements to integrated circuit structures having variations in their elevation.

U.S. No. 5,353,193 teaches a removable heat sink assembly comprised of a heat sink unit and heat spreader. The heat sink unit has at least one fin and a coupling collar for radiating heat away from a packaged electronic device. The heat spreader includes a platform attached to an inner collar in thermal contact with the packaged electronic device. The platform has one or more tabs suitable for mating with one or more flanges located on the coupling collar of the heat sink unit. Coupling grooves within the flanges engage the platform of the heat spreader when the flanges are mated with the heat spreader tabs and the heat sink is turned. The heat sink can therefore be quickly and conveniently attached to or removed from the heat spreader.

Some prior art approaches to thermal management of packaged electronic devices require the mating of individual heat sinks with individual components. The problem with this approach is that the use of individual heat sinks is expensive and the associated installation is very labor intensive. Also, function and appearance can be a problem with this approach unless each heat sink is accurately aligned with its neighbor. However, the aforementioned alignment is also labor intensive.

The use of some prior art heat sinks adapted for cooling a multiplicity of integrated circuits can also present problems. For example, some heat sinks require that each contacting surface of the of the individual integrated circuit devices be co-planar to establish an effective thermal link. Moreover, other types of heat sinks do not allow the replacement of one of the multiplicity of heat sinks without removing the entire heat sink from contact with all or most of the heat sinks. The aforementioned draw backs increase the labor and cost of maintaining arrays of integrated circuit devices requiring thermal management.

SUMMARY OF THE INVENTION

As is apparent from the above discussion, there is a need for a convenient method of providing a single heat sink apparatus to cool an array of electronic devices. There also is a need for a heat sink apparatus used to cool an array of electronic components that facilitates the convenient removal of a single electronic component of the array without having to remove the heat sink apparatus from the rest of the array. There also is a need for a heat sink apparatus used with multiple electronic components that conforms to electronic devices of different heights.

In accordance with one embodiment of the present invention, there is provided an apparatus for cooling an electronic device. The apparatus includes a base and a plurality of thermal conductors attached to the base. The apparatus further includes a layer of adhesive material disposed on the base, the adhesive being adapted to secure the base to the electronic device.

Pursuant to another embodiment of the present invention, there is provided a method of affixing a heat sink assembly to a plurality of integrated circuit devices mounted on a printed circuit board. The method includes the following steps: (1) providing a first heat sink assembly having an elastomeric base, with the elastomeric base having a layer of adhesive material disposed thereon, (2) attaching the first heat sink assembly to the plurality of integrated circuit devices such that the layer of adhesive material is interposed between the elastomeric base and the plurality of integrated circuit devices, (3) cutting the elastomeric base to form a heat sink segment, the heat sink segment being attached to a first integrated circuit device of the plurality of integrated circuit devices, and (4) removing the first integrated circuit device from the printed circuit board.

According to yet another embodiment of the present invention, there is provided a method of affixing heat sink assemblies to integrated circuit devices which includes the following steps: (1) providing a first heat sink assembly having a first base, with the first base having a first layer of adhesive material disposed thereon, and with a first strippable liner positioned over and in contact with the first layer of adhesive material, (2) removing the first strippable liner from the first layer of adhesive material, (3) positioning the first heat sink assembly in contact with a first integrated circuit device mounted on a printed circuit board such that the first layer of adhesive material is interposed between the first base and the first integrated circuit device, (4) removing the first integrated circuit device from the printed circuit board, (5) providing a second heat sink assembly having a second base, with the second base having a second layer of adhesive material disposed thereon, and with a second strippable liner positioned over and in contact with the second layer of adhesive material, (6) removing the second strippable liner from the second layer of adhesive material, (7) positioning the second heat sink assembly in contact with a second integrated circuit device such that the second layer of adhesive material is interposed between the second base and the second integrated circuit device, and (8) mounting the second integrated circuit device to the printed circuit board.

Pursuant to still another embodiment of the present invention, there is provided a method of affixing a heat sink assembly to an electronic device which includes the steps of: (1) providing the heat sink assembly having a base, with the base having a layer of adhesive material disposed thereon, and with a strippable liner positioned over and in contact with the layer of adhesive material, (2) removing the strippable liner from the layer of adhesive material, (3) and positioning the heat sink assembly in contact with the electronic device such that the layer of adhesive material is interposed between the base and the electronic device.

It is therefore an object of the present invention to provide a new and improved apparatus for cooling an electronic device.

It is another object of the present invention to provide a new and improved method of cooling an electronic device.

It is moreover an object of the present invention to provide a new and improved method of affixing a heat sink assembly to a plurality of integrated circuits.

It is still another object of the present invention to provide a new and improved method of affixing heat sink assemblies to integrated circuit devices.

It is also the object of the present invention to provide a new and improved method of affixing a heat sink assembly to an electronic device.

The above and other objects, features, and advantages of the present invention will become apparent from the following description and attached drawings.

BRIEF DESCRIPTION OF THE DRAWINGS

FIG. 3 is a side elevational view of one of three heat sink assemblies which incorporate the features of the present invention therein, with the one heat sink assembly attached to an array of integrated circuit devices mounted on a printed circuit board;

FIG. 4 is an elevational view taken along the line 4—4 of FIG. 3;

FIG. 5 is a side elevational view of a heat sink assembly which incorporates the features of the present invention therein, with the heat sink assembly attached to an array of integrated circuit devices mounted on a printed circuit board, wherein a number of the integrated circuit devices are of different heights;

DETAILED DESCRIPTION OF THE PREFERRED EMBODIMENT

Figure 1:
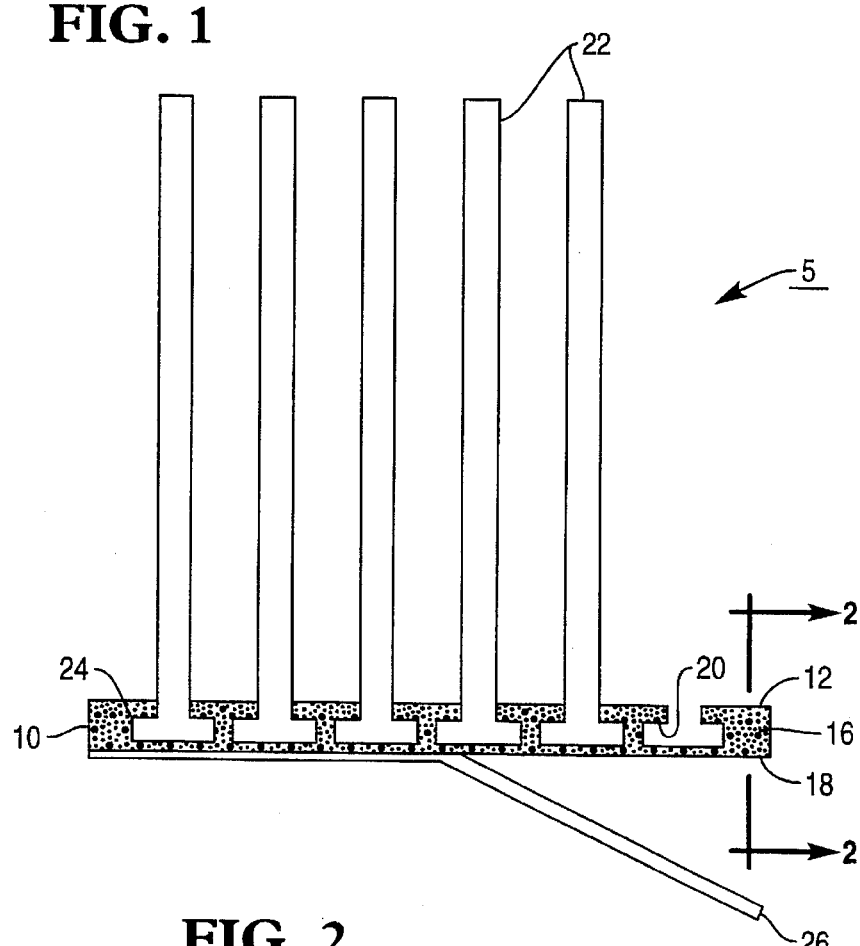
FIG. 1 is a end elevational view of a heat sink assembly which incorporates the features of the present invention therein.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 2:
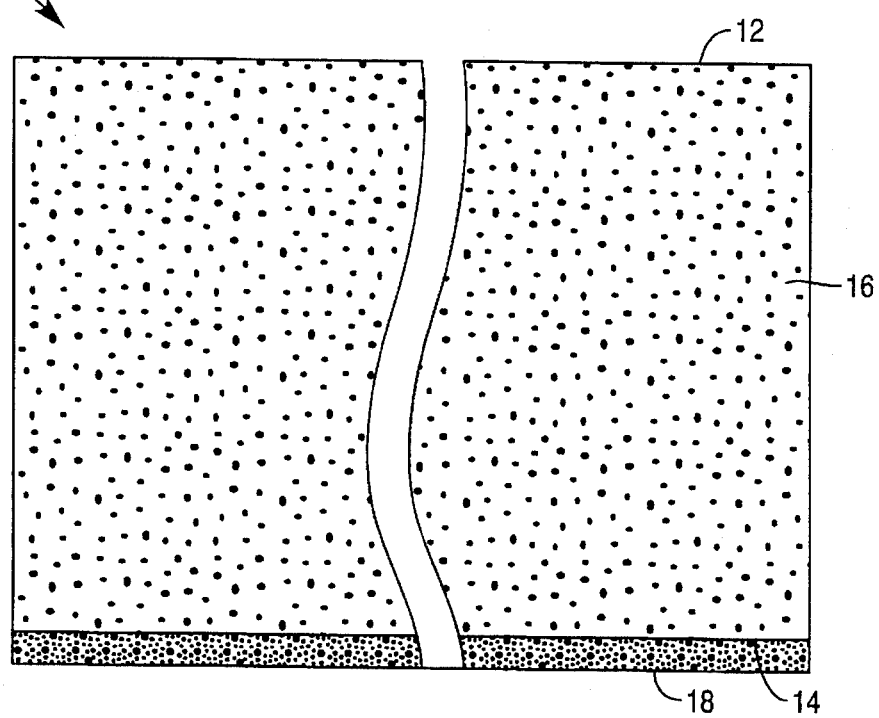
FIG. 2 is an enlarged fragmentary cross sectional view of the heat sink assembly taken along the line 2—2 of FIG. 1.

Referring to FIGS. 1 and 2, there is shown a heat sink assembly 5. The heat sink assembly 5 includes a mat or base 10 made of a thermally conductive elastomeric material. One thermally conductive elastomeric material which may be used is an Alumina filled Polyurethane material. The mat 10 includes a first surface 12 and a second surface 14 as shown in FIG. 2. The second surface 14 of the mat 10 has a layer of adhesive material 18 disposed thereon that facilitates the attachment of the mat 10 to a surface of an electronic device, such as an integrated circuit device. One adhesive material which may be used is an Acrylic adhesive material.

The first surface 12 has a plurality of receptacles 20 adapted to receive and hold a plurality of thermal conductors such as wire fins 22 in a pattern conducive to the dissipation of heat as shown in FIG. 1. The size, shape, or pitch of each wire fin 22 can be varied to tailor the cooling properties of the heat sink assembly 5 to a particular application. Each wire fin 22 has a first end portion 24 that fits into a respective receptacle 20 so that one end protrudes from the first surface 12 of the mat 10 as shown in FIG. 1. End portion 24 includes a flange as shown in FIG. 1 which maintains the end portion within the respective receptacle 20. The wire fins 22 can be made of any thermally conductive material, however, a metal such as Aluminum is preferably used in the view of its lightness and thermal conductive properties.

The mat 10 contains a plurality of thermally conductive particles 16 dispersed therein to enhance the heat flow from the electronic device through the mat 10 to the wire fins 22 where it dissipates to the surrounding environment. Preferably, the thermally conductive particles 16 are made of Alumina power or another thermally conductive ceramic material.

The adhesive material 18 has a strippable liner 26 positioned over and in contact therewith. As a result, the adhesive material 18 is interposed between the second surface 14 and the strippable liner 26, thereby protecting the adhesive material 18 until use. The strippable liner is made of a waxed paper or a polyethylene sheet.

Referring now to FIGS. 3 and 4, there is shown a printed circuit board 28 having eighteen integrated circuit devices 29 mounted thereon. The integrated circuit devices 29 are arranged on the printed circuit board 28 so as to form three rows (denoted C, D and E in FIG. 4) and six columns (denoted I, II, III, IV, V and VI in FIG. 3). Each row has a heat sink assembly 30 adhesively attached to the six integrated circuits 29 forming the respective row. Note that the heat sink assembly 30 is in thermal contact with each integrated circuit device 29 in the respective row.

The heat sink assemblies 30 shown in FIGS. 3 and 4 include a plurality of wire fins 32. The heat sink assemblies 30 are substantially similar to the heat sink assembly 5 shown in FIGS. 1 and 2, and thus will not be described in further detail. However, the heat sink assemblies 30 have a greater length. In FIGS. 3 and 4, each heat sink assembly 30 is shown after its strippable liner had been pealed off and the heat sink assembly had been adhesively attached to the respective row of integrated circuit devices 29. In operation, a flow of fluid F, such as air, is advanced against and around the wire fins 32 of the heat sink assembly 30.

FIG. 5 shows another printed circuit board 34 having six integrated circuit devices 40–45 mounted thereon. Integrated circuit device 42 is vertically shorter than each of the integrated circuit devices 40, 41, 43, 44, and 45. On the other hand, integrated circuit device 44 is vertically taller than each of the integrated circuit devices 40, 41, 42, 43 and 45. In spite of each contacting surface 35 of the integrated circuit devices 40–45 not being co-planar, a single heat sink assembly 36 is able to be adhesively attached to each integrated circuit device 40–45. The heat sink assembly 36 is substantially similar to the heat sink assembly 5 shown in FIGS. 1 and 2, and thus will not be described in further detail. However, the heat sink assembly 36 has a greater length.

The heat sink assembly 36 is further able to be in substantial physical contact with each of the contacting surfaces 35 of the integrated circuits 40–45. This is true since the heat sink assembly 36 includes an elastomeric mat (as described further with regard to FIGS. 1 and 2) which is conformable to the varying heights of the integrated circuit devices 40–45. This feature is beneficial since it provides for good thermal transfer between each of the integrated circuit devices 40–45 and the heat sink assembly 36.

Figure 6:
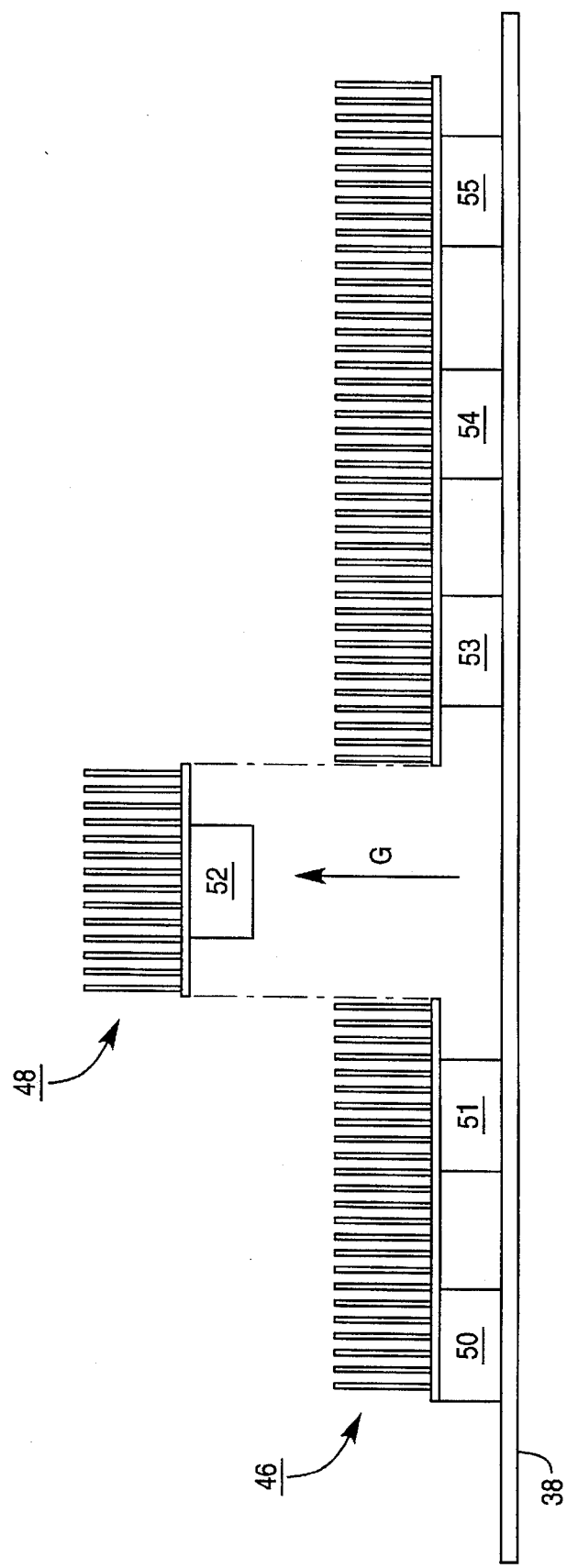
FIG. 6 is a side elevational view of a heat sink assembly which incorporates the features of the present invention therein, with the heat sink assembly attached to an array of integrated circuit devices mounted on a printed circuit board, wherein a section of the heat sink assembly has been cut and the attached integrated circuit device removed from the printed circuit board assembly.

FIG. 6 shows yet another printed circuit board 38 and six integrated circuit devices 50–55. Integrated circuit devices 50, 51, and 53, 54 and 55 are mounted on the printed circuit board 38. Integrated circuit device 52 is shown after the elastomeric mat of the heat sink assembly 46 has been cut on either side of integrated circuit device 52, and an excised heat sink segment 48 and attached integrated circuit device 52 has been lifted upwardly and away from the printed circuit board 38. The removal of the integrated circuit device 52 is illustrated by arrow G. The elastomeric mat of the heat sink assembly can be cut with any common tool, such as scissors or a shop knife.

Thereafter, the excised section 48 of the heat sink assembly 46 can be detached from the integrated circuit device 52 and reattached to a replacement integrated circuit device (not shown). Then, the replacement integrated circuit device can be mounted onto the printed circuit board 38 at the location which was previously occupied by the integrated circuit device 52. Alternatively, a new heat sink assembly section (not shown) may be cut and attached to the replacement integrated circuit device 52 before it is mounted onto the printed circuit board in the above manner.

Based upon the above description it will be understood by those skilled in the art that the heat sink assembly of the present invention may be conveniently attached to a multiplicity of electrical components whose surfaces are not on the same plane. Moreover, the heat sink of the present invention will allow the printed circuit board to flex without compromising its mechanical or thermal attributes. Furthermore, the heat sink assembly of the present invention facilitates the replacement of one or more electrical components on a printed circuit board.

While the invention has been illustrated and described in detail in the drawings and foregoing description, such illustration and description is to be considered as exemplary and not restrictive in character, it being understood that only the preferred embodiments have been shown and described and that all changes and modifications that come within the spirit of the invention are desired to be protected.

What is claimed is:

1. A method of affixing a heat sink assembly to a plurality of integrated circuit devices mounted on a printed circuit board, comprising the steps of:

providing a first heat sink assembly having an elastomeric base, with the elastomeric base having a layer of adhesive material disposed thereon;

attaching the first heat sink assembly to the plurality of integrated circuit devices such that the layer of adhesive material is interposed between the elastomeric base and the plurality of integrated circuit devices;

cutting the elastomeric base to form a heat sink segment, the heat sink segment being attached to a first integrated circuit device of the plurality of integrated circuit devices; and removing the first integrated circuit device from the printed circuit board.

2. The method of claim 1, wherein:

the providing step includes the step of providing a strippable liner positioned over and in contact with the layer of adhesive material, and the attaching step includes the step of removing the strippable liner from the layer of adhesive material.

3. The method of claim 1, wherein the elastomeric base has a plurality of thermally conductive particles contained therein.

4. A method of affixing a heat sink assembly to a plurality of integrated circuit devices mounted on a printed circuit board, comprising the steps of:

providing a first heat sink assembly having an elastomeric base, with the elastomeric base having a layer of adhesive material disposed thereon;

attaching the first heat sink assembly to the plurality of integrated circuit devices such that the layer of adhesive material is interposed between the elastomeric base and the plurality of integrated circuit devices;

cutting the elastomeric base to form a heat sink segment, the heat sink segment being attached to a first integrated circuit device of the plurality of integrated circuit devices;

removing the first integrated circuit device from the printed circuit board;

detaching the heat sink segment from the first integrated circuit device;

attaching the heat sink segment to a second integrated circuit device; and mounting the second integrated circuit device to the printed circuit board.

5. The method of claim 4, wherein said mounting step includes the step of mounting the second integrated circuit device to the printed circuit board at the location previously occupied by the first integrated circuit device.

6. A method of affixing a heat sink assembly to a plurality of integrated circuit devices mounted on a printed circuit board, comprising the steps of:

providing a first heat sink assembly having an elastomeric base, with the elastomeric base having a layer of adhesive material disposed thereon;

attaching the first heat sink assembly to the plurality of integrated circuit devices such that the layer of adhesive material is interposed between the elastomeric base and the plurality of integrated circuit devices;

cutting the elastomeric base to form a heat sink segment, the heat sink segment being attached to a first integrated circuit device of the plurality of integrated circuit devices;

removing the first integrated circuit device from the printed circuit board;

providing a second integrated circuit device;

attaching a second heat sink segment to the second integrated circuit device; and mounting the second integrated circuit device to the printed circuit board.

7. The method of claim 6, wherein said mounting step includes the step of mounting the second integrated circuit device to the printed circuit board at the location previously occupied by the first integrated circuit device.

* * * * *